United States Patent
Adler et al.

(10) Patent No.: US 9,443,992 B2
(45) Date of Patent: Sep. 13, 2016

(54) SOLAR PANEL AUTONOMOUS CLEANING DEVICE

(76) Inventors: Jeffrey Scott Adler, Beaconsfield (CA); Harold Russell Baird, Marietta, GA (US)

(*) Notice: Subject to any disclaimer, the term of this patent is extended or adjusted under 35 U.S.C. 154(b) by 216 days.

(21) Appl. No.: 13/507,954

(22) Filed: Aug. 9, 2012

(65) Prior Publication Data
US 2014/0041138 A1    Feb. 13, 2014

(51) Int. Cl.
  *H01L 21/00* (2006.01)
  *H01L 31/02* (2006.01)
  *H02S 40/10* (2014.01)

(52) U.S. Cl.
  CPC .............. *H01L 31/02* (2013.01); *H02S 40/10* (2014.12)

(58) Field of Classification Search
  CPC .................................... A47L 1/02; A02S 4/10
  USPC .......................... 15/102, 103, 250.11, 250.13
  See application file for complete search history.

(56) References Cited

U.S. PATENT DOCUMENTS

| | | | |
|---|---|---|---|
| 5,655,247 A * | 8/1997 | Allen et al. | 15/103 |
| 6,546,590 B2 * | 4/2003 | Waters | B60R 1/0602 |
| | | | 15/250.003 |
| 7,503,091 B2 * | 3/2009 | White et al. | 15/103 |
| 7,576,658 B2 * | 8/2009 | Ishikawa | B60S 1/0818 |
| | | | 15/250.001 |

FOREIGN PATENT DOCUMENTS

| | | | |
|---|---|---|---|
| CN | 201721424 U | * | 1/2011 |
| CN | 202461076 U | * | 10/2012 |
| EP | 2048455 A2 | | 4/2009 |
| GB | 2 358 843 A | | 8/2001 |
| JP | 2010/161141 | | 7/2010 |

* cited by examiner

*Primary Examiner* — Shay Karls

(57) ABSTRACT

Described herein is an autonomous cleaning device for a solar panel. The device includes a cleaning member mounted for unidirectional movement or bidirectional movement over the solar panel. The cleaning member has a first cleaning portion for cleaning the solar panel as the cleaning member moves in one direction and a second cleaning portion for cleaning the solar panel as the cleaning member moves in the other direction. The cleaning portions are respectively brought into contact with the solar panel by axial rotation of the cleaning member about a restricted path of travel.

111 Claims, 15 Drawing Sheets

SOLAR PANEL AUTONOMOUS CLEANING DEVICE

TECHNICAL FIELD

The present relates to autonomous cleaning devices, and more particularly to an autonomous device for cleaning a solar panel.

BACKGROUND

Solar panels are now commonplace as efficient, clean energy sources. A solar panel includes an array of solar cells covered by a transparent protective cover through which sunlight transmits to reach the solar cells. During use, the transparent protective cover outer surface may become dirty as a result of an accumulation of: dust, soil, tree debris, sand, moss, dirt, sap, bugs, bird droppings, water spots or mold, thereby significantly reducing the panel efficiency. In solar parks, where multiple solar panels are located, often in remote areas, routine cleaning is labor intensive, requiring cleaning crews to clean the panels several times per month at considerable cost. Furthermore, where solar panels are mounted high, for example on residential or commercial rooftops, the cleaning crews risk serious injury from falls.

Several solar panel cleaning devices are known and have been used with limited success to address the above noted problems. For example, many known cleaning systems use a water reservoir to spray the solar panel with a flocculent solution, but these are largely ineffective at cleaning the solar panels and are considered to be environmentally unfriendly. One additional device described in European patent application number EP2048455A2 to Diaz et al for "Automatic Solar Panel Cleaning System" uses roller cleaning brushes which, when activated by a rain sensor, roll across the surface of the solar panels to sweep away the debris which has accumulated thereon. The system of Diaz, while straightforward to operate, suffers from several important disadvantages. The roller brushes merely brush the debris along the surface of the solar panels and may leave behind residual debris. Furthermore, the rain sensor does not detect rain intensity; therefore it is likely that the system of Diaz would be less effective, since it is not designed to take advantage of the cleansing assist that adequate rain intensity provides.

Thus, there is a need for an improved solar panel cleaning device which addresses the above-noted problems.

BRIEF SUMMARY

We have designed a solar panel cleaning device and system which can be either an after-market assembly attached to different size solar panels, or incorporated into a production design. The system senses the presence of rain intensity thereon and autonomously cleans a solar voltaic panel using a combination of cleaning inserts, which may be pads, wipers or brushes. Advantageously, the cleaning inserts can be easily removed and replaced during routine maintenance, and trimmed to the panel size. If desired, the cleaning inserts can be interchanged to suit the needs of the particular environment. Moreover, the device does not require connection to an external fluid source, such as a fluid reservoir, but in arid climates can be teamed with such technology including user supplied or precipitation gathering systems or devices. The cleaning cycle may be bi-directional, or uni-directional. The uni-directional mode can be selected for use in environments where there is diminished solar power output, diminished rainfall, or in less dirty environments. In these cases, sufficient cleaning can realized with a single direction cleaning, which does not require the cleaning member to move in both the first and second directions.

Accordingly, there is provided an autonomous cleaning device for a solar panel, the device comprising:

a cleaning member mounted for unidirectional movement or bidirectional movement over the solar panel, the cleaning member having a first cleaning portion for cleaning the solar panel as the cleaning member moves unidirectionally and a second cleaning portion for cleaning the solar panel as the cleaning member moves bidirectionally, the first and second cleaning portions being respectively brought into contact with the solar panel by axial rotation of the cleaning member about a restricted path of travel.

In one example, the first and second cleaning portions each includes an extension body having a slot to slidably engage one or more cleaning inserts. The cleaning insert is a pad or a brush for sweeping the solar panel, or a wiper for scraping the solar panel. The cleaning inserts are spaced apart and extend from the cleaning member towards the solar panel. The cleaning inserts are interchangeable.

In one example, the device further includes a third cleaning portion.

In another example, the device further includes two spaced apart stops. The cleaning member includes two stopping portions for contacting the respective stops when the cleaning member moves unidirectionally or bidirectionally, the stops forcing the cleaning member to axially rotate so that either the first or the second cleaning portions contacts the solar panel. The unidirectional movement of the cleaning member is abbreviated to avoid contacting the stops so that the first cleaning portion is always in contact with the solar panel.

In one example, the cleaning member tapers away from the first and second cleaning portions.

In another example, the cleaning member is movably mounted on the top, sides, or bottom of a frame. The frame includes a drive assembly to drive the cleaning member across the solar panel. The drive assembly includes: a) at least one drive shaft; b) a gear connected to the drive shaft; and c) a prime mover connected to the gear. The drive assembly includes one drive shaft in a shaft enclosure. The drive assembly includes two drive shafts disposed substantially parallel to each other. The two drive shafts are respectively enclosed in two shaft enclosures. The drive assembly includes a guide having a guide slot therein, the guide being located substantially parallel to the drive shaft. A cross shaft connects the two drive shafts.

In one example, the device further includes one or more mounting straps and a mounting buckle or a clamp for locating the device over the solar panel.

In another example, a moisture intensity sensor is in communication with the cleaning member, the moisture intensity sensor being located adjacent the solar panel or integral with the panel. The moisture intensity sensor is a rain sensor.

In one example, a temperature sensor is in communication with the cleaning member, the temperature sensor being located adjacent the solar panel or integrated into the panel production design.

In another example, a controller is connected to a moisture intensity sensor and a temperature sensor, the controller being powered by a power supply. The power supply is an autonomous power supply. The autonomous power supply is a photovoltaic cell array or a battery or user supplied power.

In one example, the device is located on a pedestal or frame.

In another example, the device is mounted on the roof, the side of a building or on the ground.

In another example, the device is mounted on a window or skylight, and for any transparent semi-transparent, or opaque materials, and connected to user supplied power.

In one example, the device is connected to a washing system for spraying a liquid on the solar panel or allowing collected rainwater from drainage channels along a panel frame to be implemented.

In another example, the cleaning member extension body and cleaning inserts include complimentary grooves, humps or indentations to provide a releasable lock to permit pad, brush and wiper installation and replacement.

In another example, the cleaning inserts are attached by screws to the extension bodies.

In yet another example, the cleaning inserts are clamped to the extension bodies.

According to another aspect, there is provided an autonomous cleaning device for a solar panel, the device comprising:

a cleaning member mounted for movement in one direction over the solar panel, the cleaning member having a first cleaning portion having one or more cleaning inserts for cleaning the solar panel as the cleaning member moves in the one direction along a restricted path of travel.

According to another aspect, there is provided an autonomous cleaning device for a solar panel, the device comprising:

a cleaning member mounted for bidirectional movement over the solar panel, the cleaning member having a first and second cleaning portions for cleaning the solar panel as the cleaning member move thereover, the first and second cleaning portions being respectively brought into contact with the solar panel by axial rotation of the cleaning member about a restricted path of travel.

According to an alternative aspect, there is provided a system for autonomously cleaning a solar panel, the system comprising:

a moisture intensity sensor;
a temperature sensor;
a controller in communication with the sensors; and
a cleaning member mounted for unidirectional movement or bidirectional movement over the solar panel, the cleaning member being in communication with the controller, the cleaning member having a first cleaning portion and a second cleaning portion, the system being configured such that in response to an amount of moisture being detected on the moisture intensity sensor the controller activates the cleaning member such that:
  (i) the cleaning member moves unidirectionally and the first cleaning portion cleans the solar panel; or
  (ii) the cleaning member moves bidirectionally and the first cleaning portion cleans the solar panel; and the cleaning member stops and axially rotates about a restricted path of travel so that the second cleaning portion is brought into contact with the solar panel and the second cleaning portion cleans the solar panel.

According to another alternative aspect, there is provided a system for autonomously cleaning a solar panel, the system comprising:

a moisture intensity sensor;
a temperature sensor;
a controller in communication with the sensors; and
a cleaning member mounted for movement in one direction over the solar panel, the cleaning member being in communication with the controller, the cleaning member having a first cleaning portion, the system being configured such that in response to an amount of moisture being detected on the moisture intensity sensor, the controller activates the cleaning member such that the cleaning member moves in the one direction along a restricted path of travel and the first cleaning portion cleans the solar panel.

According to yet another alternative aspect, there is provided a system for autonomously cleaning a solar panel, the system comprising:

a moisture intensity sensor;
a temperature sensor;
a controller in communication with the sensors; and
a cleaning member mounted for bidirectional movement over the solar panel, the cleaning member being in communication with the controller, the cleaning member having a first cleaning portion and a second cleaning portion, the system being configured such that in response to an amount of moisture being detected on the moisture intensity sensor the controller activates the cleaning member such that the cleaning member moves bidirectionally and the first cleaning portion cleans the solar panel; and the cleaning member stops and axially rotates about a restricted path of travel so that the second cleaning portion is brought into contact with the solar panel and the second cleaning portion cleans the solar panel.

BRIEF DESCRIPTION OF THE DRAWINGS

In order that the discovery may be readily understood, embodiments are illustrated by way of example in the accompanying drawings.

Further details of the device and its advantages will be apparent from the detailed description included below.

DETAILED DESCRIPTION

Figure 1:
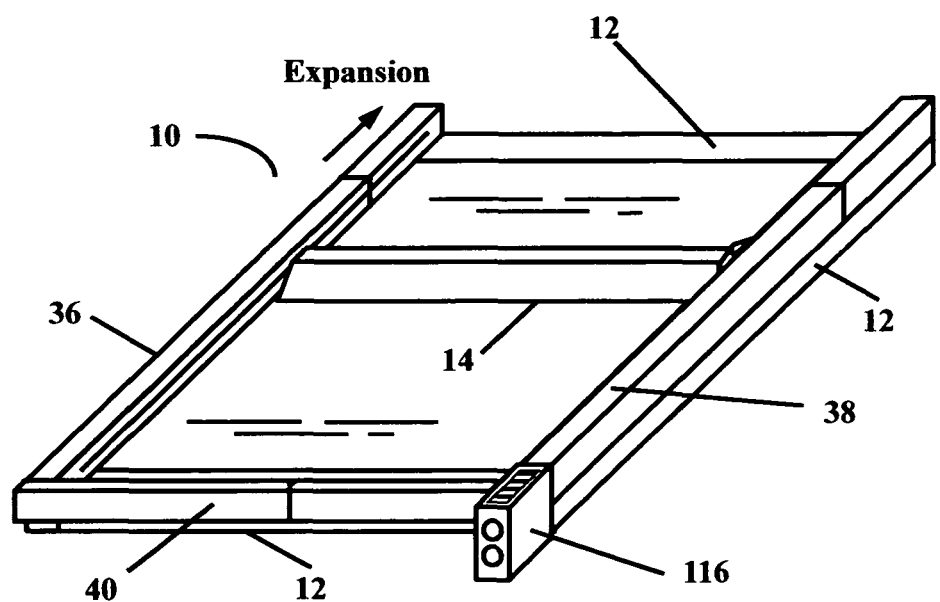
FIG. 1 is a perspective view of a cleaning device mounted on a solar panel.

Referring now to FIG. 1, an autonomous cleaning device and system is shown generally at 10. The device 10 is mounted over a solar panel 12. The device 10 and solar panel 12 may be located on a pedestal or frame such as in a solar park or may be located on the side or rooftop of a residential or commercial building or on the ground. A person skilled in the art will recognize that although a single solar panel is referred to throughout, it is to be understood that a plurality of devices 10 may also be used with a plurality of solar panels 12. Furthermore, the autonomous cleaning device 10 can also be mounted on and for to clean skylights and windows and for any transparent, semi-transparent or opaque materials including glass, plastic, composite materials and the like. Generally speaking, the device 10 comprises a cleaning member 14 that is mounted for movement over the solar panel 12 in one direction (uni-directional) or two opposite directions (bi-directional), along generally longitudinal or lateral paths of travel, to clean substantially the entire surface of the solar panel. The nature of the autonomous device and system includes the ability of the controller and sensors to harness the power from which the device is attached thereto, or from a nearby device, including user supply AC power, a solar voltaic panel or an optional battery pack that may or may not be charged by the solar voltaic panel (for single solar panel site assemblies) for example, and subsequently power the cleaning assembly in a cleaning cycle whereby a one or two directional cleaning may be required. When required, the cleaning device 10 can be connected to a washing system. The washing system may include a liquid such as water or detergent which is sprayed onto the solar panel as a supplement to, or in lieu of, natural rainfall.

Figure 2:
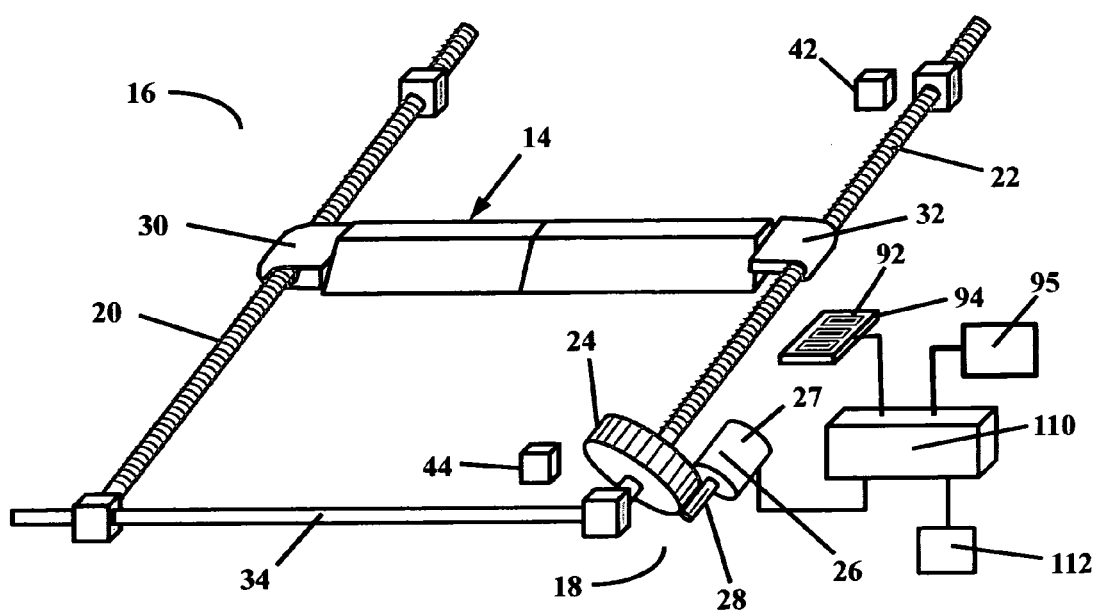
FIG. 2 is a perspective view of the cleaning device of FIG. 1 showing a dual drive assembly.
Figure 3:
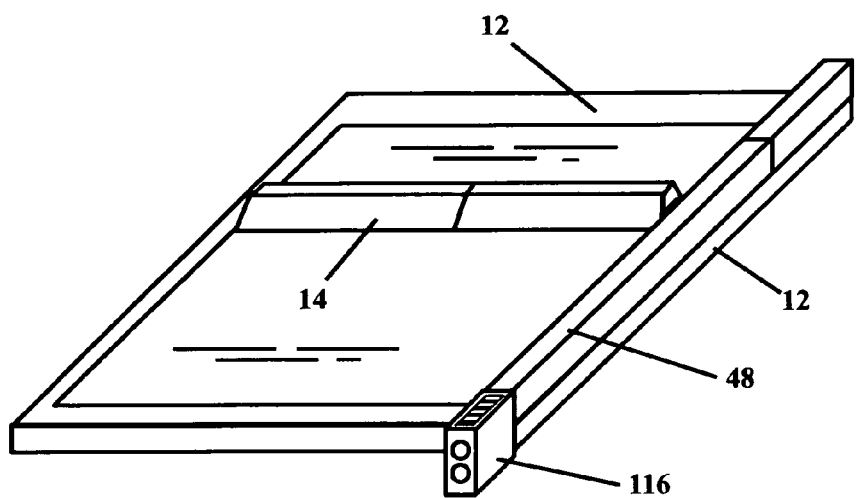
FIG. 3 is a perspective view of an alternative cleaning device and a single drive assembly mounted on a solar panel.
Figure 4:
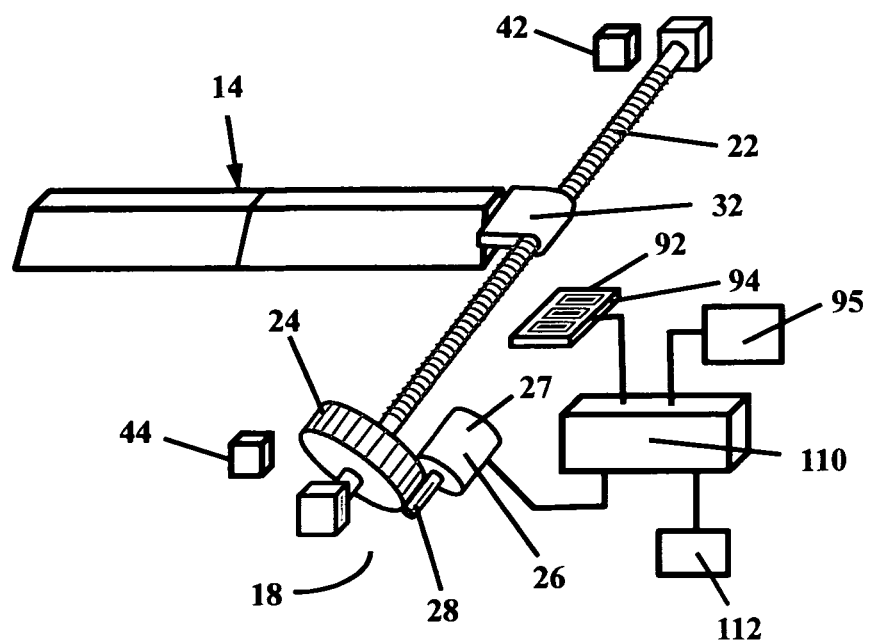
FIG. 4 is a perspective view of the cleaning device of FIG. 3 showing the single drive assembly.
Figure 15:
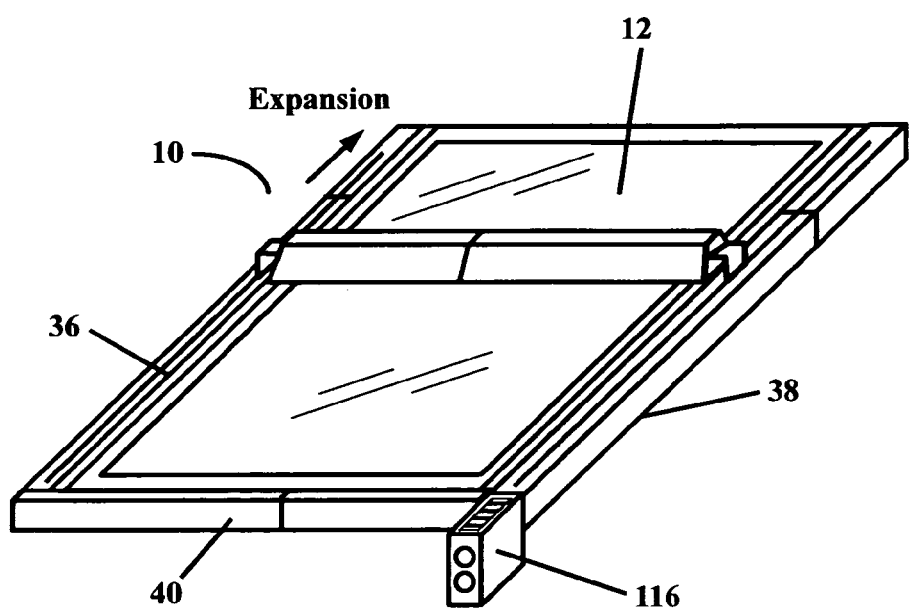
FIG. 15 is a perspective view of the cleaning device of FIG. 2 showing an example of a side mount.

Referring now to FIGS. 2, 4 and 15, to permit movement in the one or two directions, the cleaning member 14 is movably mounted on a generally square or rectangular frame 16. The dimensions and shape of the frame 16 depend on the dimensions and shape of the solar panel 12 to be cleaned, although generally speaking the frame 16 is either square or rectangular. The frame 16 includes a drive assembly 18, which drives the cleaning member 14 across the solar panel 12 during a cleaning operation. In one example, the drive assembly 18 is a dual drive assembly and includes two threaded drive shafts 20, 22, which are disposed substantially parallel to each other. A toothed gear wheel 24 is connected to one end of the drive shaft 22, although in some examples, two gear wheels can be connected, one on each of the drive shafts. A prime mover 26, such as a drive motor 27, includes a toothed portion 28 which meshes with the gear wheel 24 teeth to drive the gear wheel 24 and therefore the drive shaft 22. The cleaning member 14 includes two driven end portions 30, 32 which are mounted on each of the threaded drive shafts 20, 22 for movement therealong when the drive motor 26 is activated. One or more cross shafts 34 are connected between the two drive shafts 20, 22 to transfer rotation to drive shaft 20 and add rigidity and stability to the drive assembly 18. The two drive shafts 20, 22 are respectively housed within two shaft enclosures 36, 38, and the cross shafts 34 are housed within a cross shaft enclosure 40. The cleaning device 10 also includes two spaced apart stops 42, 44, which are located at either end of the frame 16. The stops 42, 44, which are projections extending away from the frame 16, abut the cleaning member 14 as it reaches the respective ends of the solar panel 12. The stops 42, 44 can be cuboid stops or alternatively they can be ramps against which the cleaning member 14. Alternatively, the cleaning member 14 can be mounted for movement in one direction only over the solar panel 12. In this case, the cleaning member 14 moves in the first direction along a restricted path of travel. In the first direction only movement, the movement of the cleaning member 14 is abbreviated to avoid contacting the stops 42, 44 so that the first cleaning portion is always in contact with the solar panel 12, which may have more than one cleaning insert Referring now to FIGS. 3 and 4, an alternative drive assembly 18 includes one drive shaft 22. The cleaning member 14 is connected to the drive shaft 22 as described above for two drive shafts. The single drive shaft 22 is enclosed in a shaft enclosure 48. The cleaning member 14 includes a free end 50 which permits a lower cost assembly.

Figure 5:
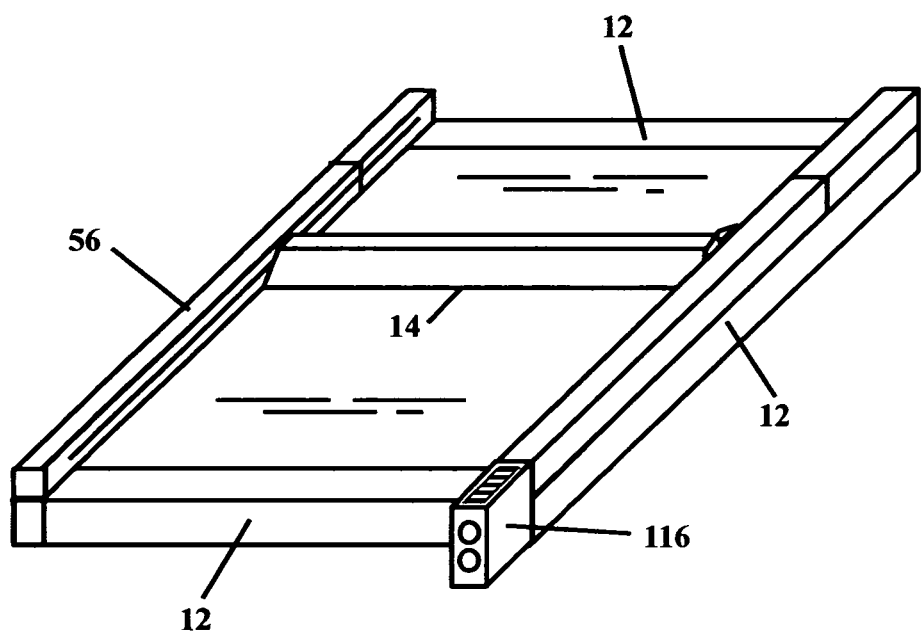
FIG. 5 is a perspective view of an alternative cleaning device and a guide slot assembly.
Figure 6:
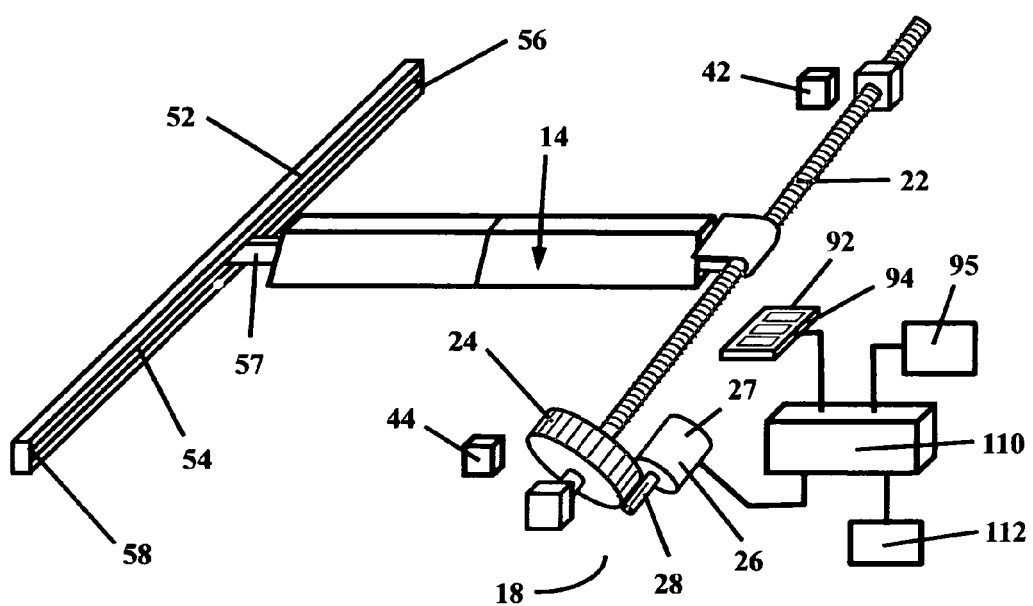
FIG. 6 is a perspective view of the cleaning device of FIG. 5 showing the drive slot and the single drive assembly.

Referring now to FIGS. 5 and 6, another alternative drive assembly 18 includes a single drive shaft 22 and a guide 52, which is located substantially parallel to the drive shaft 22. The guide 52 includes a guide slot 54 which extends substantially the entire length of a guide enclosure 56. The cleaning member 14 includes a tongue 57, which extends away from one end adjacent the guide 52 for slidable engagement with the guide slot 54. Thus, the guide slot 54 provides a restraint to cleaning member 14 to ensure proper contact of the cleaning member 14 with the panel 12 surface. Each end of the guide slot 54 includes two guide slot stops 56, 58 against which the tongue abuts when the cleaning member 14 moves in either of the two directions. Thus, the guide slot stops 56, 58 permit movement of the cleaning member 14 along two restricted paths of travel in the two directions.

Figure 7:
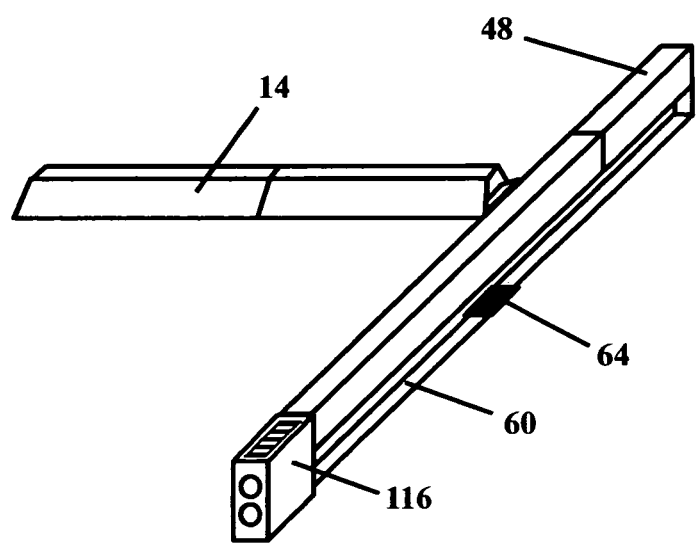
FIG. 7 is a partial perspective view of a single drive assembly showing a mounting strap.
Figure 8:
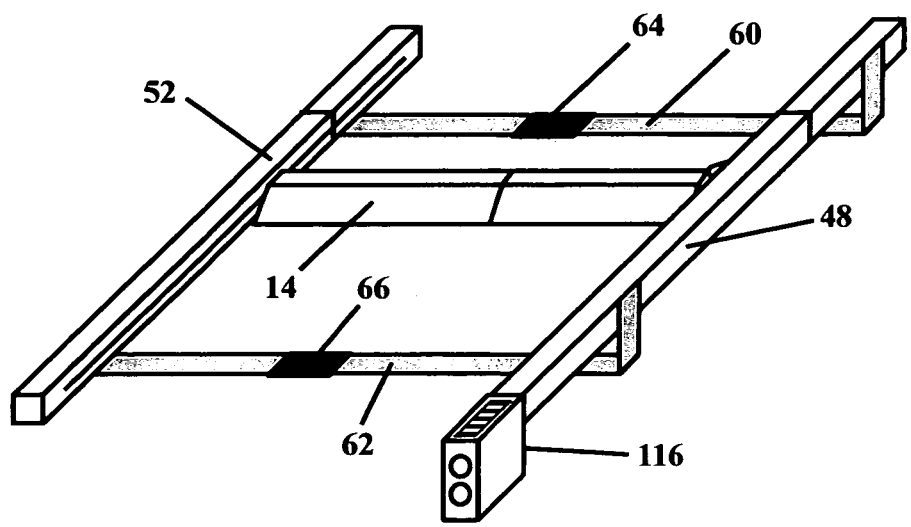
FIG. 8 is a perspective view of a cleaning device showing two mounting straps.

Referring now to FIGS. 7 and 8, to permit location of the device 10 over the solar panel 12, mounting straps 60, 62 with respective mounting buckles 64, 66 are located on the underside of the frame 16. Instead of mounting buckles, clamps may also be used. Referring specifically to FIG. 7, for the drive assembly 18 having the single drive shaft 22, a mounting strap 60 with a buckle 64 is located underneath the drive shaft enclosure 48. Referring specifically to FIG. 8, for the drive assembly 18 having either two drive shafts 20 or 22 or a single drive shaft 22 with the guide 52, two mounting straps 60, 62 are located underneath the driveshaft enclosures or underneath the drive shaft enclosure 48 and the guide 52.

Figure 9:
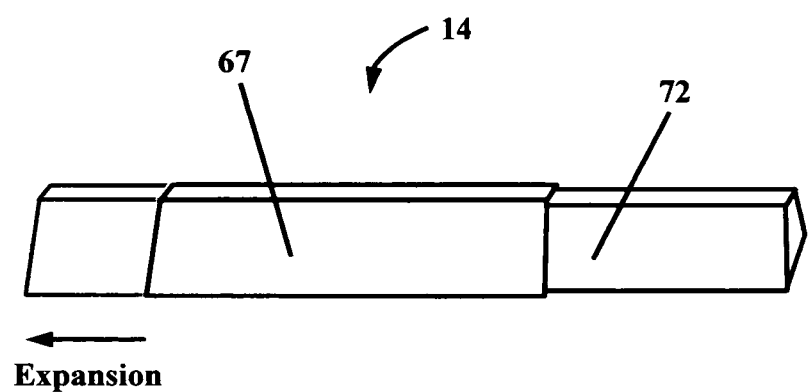
FIG. 9 is a perspective view of a wiper/blade cover showing expansion capability.
Figure 10:
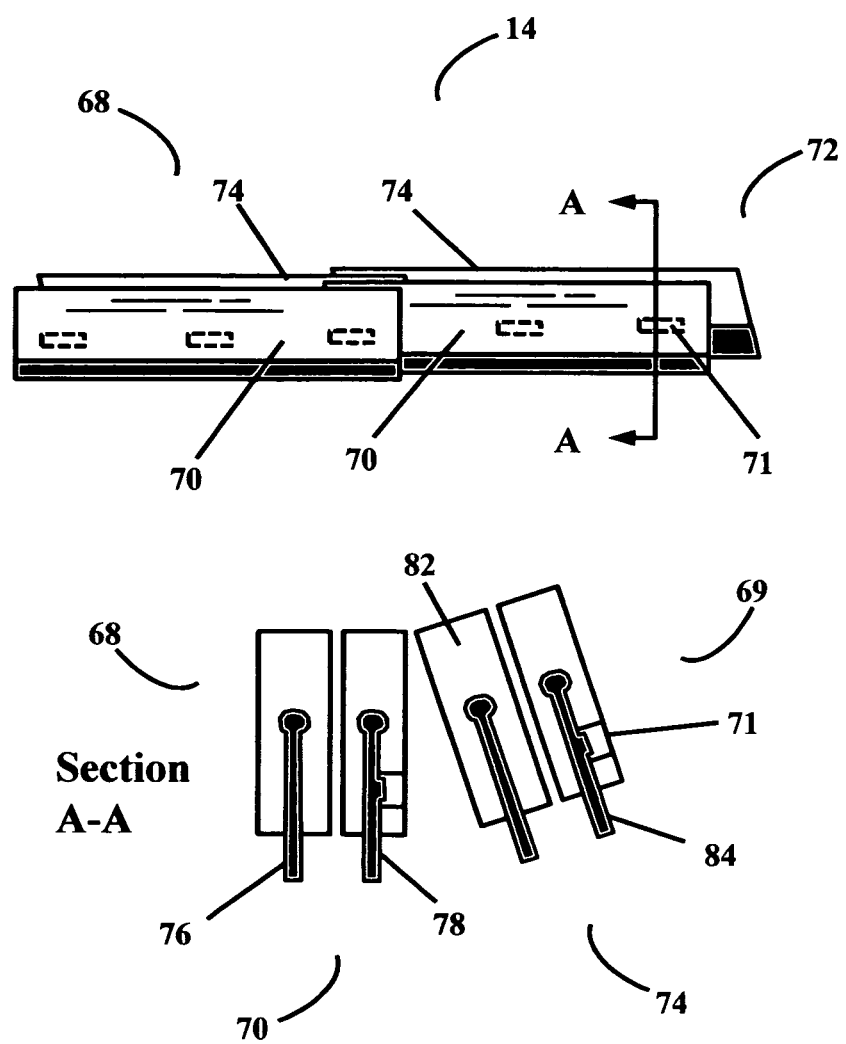
FIG. 10 is a perspective view of a wiper/blade assembly showing expansion capability and details of a pad subassembly and a wiper subassembly taken along line A-A.

Referring now to FIGS. 9, and 10, the cleaning member 14 extends between the either of the two drive shafts 20, 22 or from the single drive shaft 22 depending on the drive assembly 18 and is expandable to move over and clean the solar panel 12. The cleaning member 14 includes interlocking covers 67 and 72, which slide longitudinally relative to each other to expand as required to cover the panel surface 12. Located within the cover 67 is a first cleaning portion 68 which is a sweeper 70 for sweeping the solar panel 12 as the cleaning member 14 moves in one direction. Located within the cover 67 is a second cleaning portion 69, which is a scraper 74 for scraping the solar panel 12 as the cleaning member 14 moves in the second, opposite direction. Located within the cover 72 is a first cleaning portion 68 which is a sweeper 70 for sweeping the solar panel 12 as the cleaning member 14 moves in one direction. Contained within the cover 72 is a second cleaning portion 69, which is a scraper 74 for scraping the solar panel 12 as the cleaning member 14 moves in the second, opposite direction.

Still referring to FIG. 10, The first and second cleaning portions 70 and 74 have recesses 71 and slots 75 which mate with cleaning inserts 76, 78, 82 and 84 for easy insertion and removal, and positive lock engagement.

Figure 11:
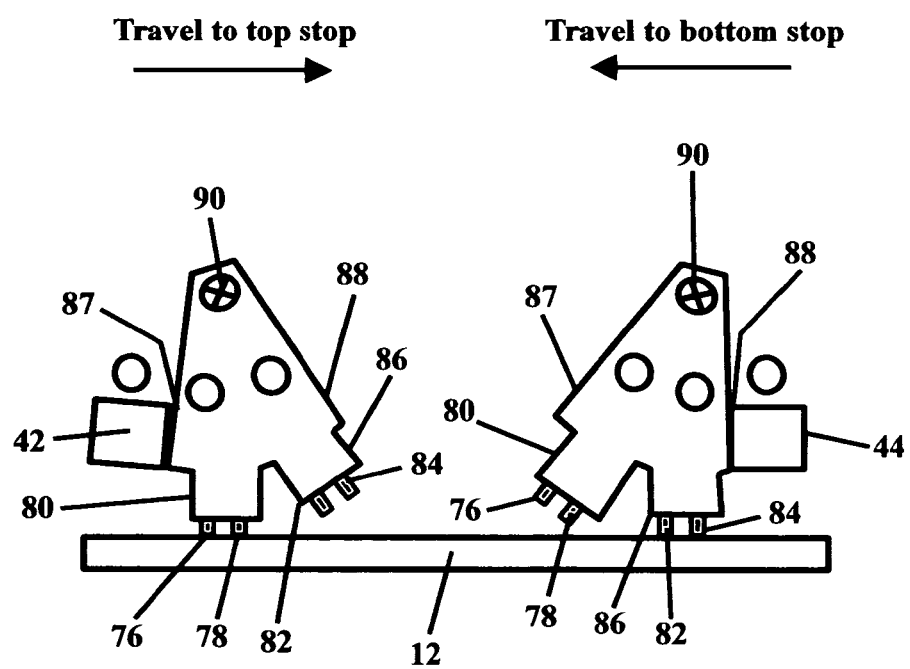
FIG. 11 is a diagrammatic representation of a cleaning member moving across the solar panel.

Referring now to FIG. 11, the sweeper 70 and the scraper 74 are spaced apart and extend from the cleaning member 14 towards the solar panel 12. The sweeper 70 includes one or more spaced apart pads and/or brushes 76, 78 mounted on an extension body 80, whereas the scraper 74 includes two spaced apart wiper blades 82, 84, which extend from a curved lower portion 86 of the cleaning member 14. When viewed in cross section, the cleaning member 14 is generally triangular and generally tapers away from the sweeper 70 and the scraper 74. For ease of routine maintenance and replacement of worn parts, the pads and or brushes 76, 78 and the blades 82, 84 are detachable from the cleaning member 14. For use in unidirectional mode, the cleaning portion includes a sweeper and a scraper to permit cleaning in a single pass over the solar panel.

Still referring to FIG. 11, the cleaning member 14 includes two stopping portions 87, 88 for contacting the respective stops 42, 44 when the cleaning member 14 moves in the first and second directions (as indicated by the arrows). The stops 42, 44 force the cleaning member 14 to axially rotate about a mounting pin 90 so that either the sweeper 70 or the scraper 74 contacts the solar panel 12. The sweeper 70 and the scraper 74 are thus each respectively brought into contact with the solar panel 12 by the axial rotation of the cleaning member 14 about a restricted path of travel.

Referring now to FIGS. 2, 4, and 6, a moisture intensity sensor 92 is in communication with the cleaning member 14 for its operation. For most applications, a single moisture intensity sensor 92 is sufficient for one or more panels, especially when the device 10 is used in solar parks. The moisture intensity sensor 92 is typically located adjacent or near the solar panel 12 or it can be integrated into the panel. The moisture intensity sensor 92 is a rain sensor 94. The rain sensor 94 detects the presence of adequate rain intensity, which the cleaning device 10 uses to effectively clean the solar panel 12. The sensor 94 is tilted at an angle that allows raindrops to run from top to bottom thereof.

Figure 12:
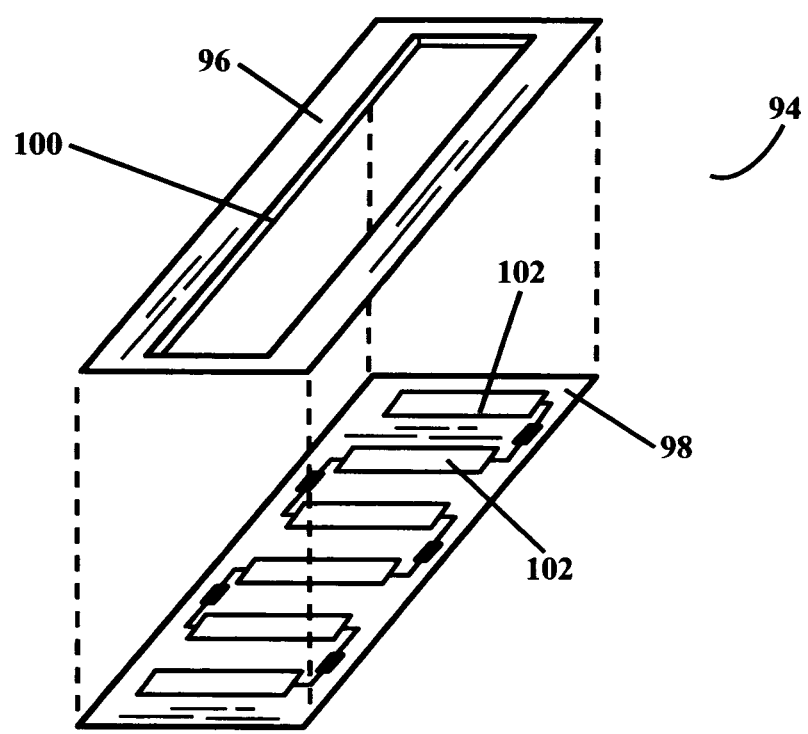
FIG. 12 is an exploded view of a rain intensity sensor.
Figure 13:
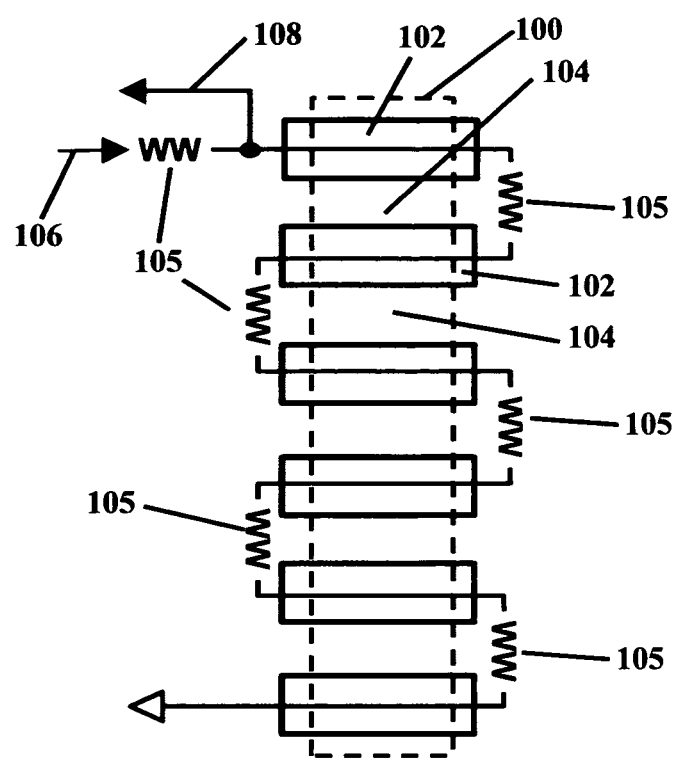
FIG. 13 is a circuit diagram of the rain intensity sensor.

Referring now to FIGS. 12 and 13, the sensor 94 includes a sensor cover 96 located over a sensor circuit 98 and includes a gasket 100 to prevent lateral leakage of the rain water. The sensor circuit 98 includes a plurality of foil strips 102 which are spaced apart to define a plurality of gaps 104 (also known as exposed sensor areas) that are less than a raindrop splatter size. The strips 102 are typically made from aluminum foil, although any electrically conductive foil material will work. The strips 102 are electrically connected in series and include a plurality of resistors (RN) 105. The circuit 98 is grounded. A reference voltage 106 is used to compare with a signal voltage 108 generated when a raindrop splatter falls onto one or more of the gaps 104. If the raindrops are infrequent, not all gaps 104 between the foil strips 102 will be bridged with raindrop water. The resistance of any bridged gap 104 will reduce to the parallel resistance of RN and the water resistance. Since heavier rain will cause more gaps to be bridged, the sensor resistance is a measure of rain intensity.

Referring back to FIGS. 2, 4, and 6, a controller 110 is connected to the moisture intensity sensor 92. The controller 110 and the moisture sensor 92 are powered by an autonomous power supply 112 and/or a user supply power. In one example, the autonomous power supply 112 is a photovoltaic cell. A temperature sensor (not shown) is electrically connected to the controller 110.

As best illustrated in FIGS. 1 through 8, the controller 110, the moisture intensity sensor 92, the gear wheel 24 and the motor 26 can all be located in a single housing 116 located near one end of the drive shaft 22. The controller 110, temperature sensor, and moisture intensity sensor 92 may also be located off the panel 12 and connected to the photovoltaic output and drive motors 26 of a plurality of panels 12.

Figure 14:
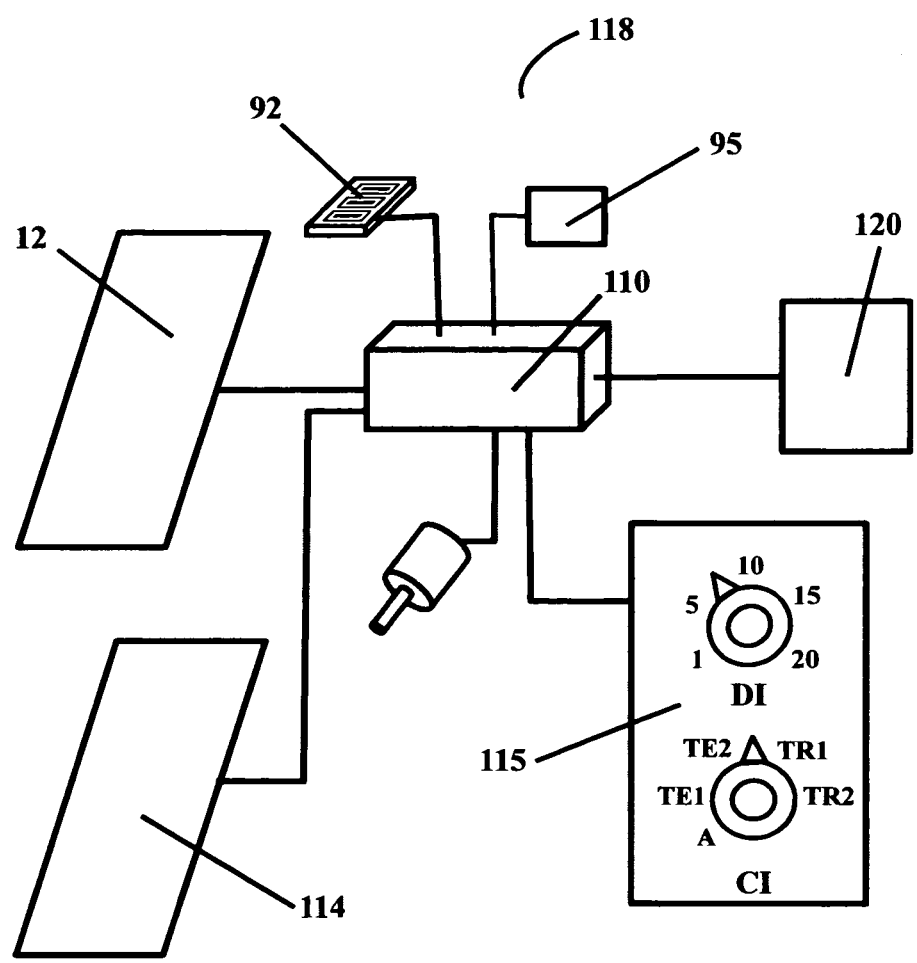
FIG. 14 is a schematic representation of a solar panel cleaning system.

Referring still to FIGS. 2, 4, 6 and now FIG. 14, a system 118 for autonomously cleaning a solar panel 12 includes the moisture intensity sensor 92, the temperature sensor 95, the controller 110, which is in communication with the sensor 92; and the cleaning member 14 which is in communication with the controller 110. In multiple panel installations, one or more co-power panels 114 may be connected to controller 110 to support autonomous operation. A 12 volt converter or battery 120 is optionally connected to the controller 110, and is user powered such as by a remotely controllable independent power supply or charger. The system 118 is configured such that in response to an amount of rain being detected on the moisture intensity sensor 92, the controller 110 activates the cleaning member 14 such that the cleaning member 14 moves in the first direction and the sweeper 70 sweeps the solar panel 12, and then the cleaning member 14 stops. For bi-directional cleaning, the cleaning member axially rotates about its restricted path of travel so that the scraper 74 is brought into contact with the solar panel 12 and the scraper 74 scrapes the solar panel 12 as the cleaning member 14 moves in the second direction.

Operation

Using the dual drive shaft assembly and bi-directional cleaning as an example, the operation of the cleaning device 10 and system 118 will now be described with reference to FIGS. 2 and 11. A bi-directional cleaning cycle begins with the cleaning member 14 moving from the bottom to the top of the solar panel 12 with the sweeper 70 sweeping the solar panel cover surface. At the top of the solar panel 12, the cleaning member 14 axially rotates so that the scraper 74 is pressed against the panel surface. As the cleaning member 14 moves from top to bottom, the scraper 74 squeegees off the remaining surface dirt/precipitation. At the bottom, the cleaning member 14 axially rotates to press the sweeper 70 against the panel surface. The controller 110 determines if sufficient precipitation is present to autonomously commence the cleaning cycle. If desired, the cleaning cycle can include several movements of the cleaning member 14 across the solar panel 12 or can include a single movement in each of the two directions. The number of cleaning cycles can be pre-selected depending on the needs of the solar park operator, for example. The device 10 includes a climate index setting control (dial) on the controller 110 that can be manually adjusted for differing weather environments to effectively tailor the cleaning program to match the environmental conditions and geographic locations. The climate index dial is effectively a weather dial that has manual settings to identify climatic environments which may vary from arid to temperate to tropical weather conditions. The device 10 includes another manual setting dial with regard to dirt and dust whereby the dirt index that ranges from for example 1 to 20, shall communicate with the controller for scheduling the cleaning member in environments that have varying degrees of airborne dirt particles that may affect the cleaning cycle regardless of precipitation. The controller 110 can address and effectively clean a solar panel 12 in environments with significant or minimal precipitation whereby scheduled cleanings are done if programmed off times have elapsed since the last cleaning. The controller 110 can sense the availability of external power and schedule nighttime cleaning cycles to take advantage of nighttime rain or morning dew.

In certain circumstances, such as diminished solar power output, diminished rainfall, or in less dirty environments, cleaning can be effected using only one direction cleaning.

This uni-directional cleaning is sufficient to clean the solar panel after one pass thereover and reduces the need for the bi-directional cleaning cycle.

As described herein, the device 10 can be easily installed on various sized solar panels via mounting straps on the back of the solar panel whereby the device can be attached to the top, sides or bottom of the outside frame of the solar voltaic panel. Furthermore, the device 10 can be made to accommodate thin film panels that may be curved or shaped.

Generally speaking, the device 10 can be produced in a range of sizes to fit, for example, 75 to 125 watts class; 125 to 175 watts class; and 175 to 225 watt class solar panels. Each device size is adjustable to fit solar panels 12 within each wattage class by means of overlapping enclosures, wiper blades and wiper pads. Adjustments for solar panel length can use an overlapping cover, but the drive shaft(s) is/are sized for the largest solar panel in the category, and is trimmed if necessary to length. All adjustments and trimming can be easily done when the device is installed on the solar panel 12. The device 10 can also be cost effectively incorporated into the design and manufacturing of a production panel by anyone familiar with the art.

In the event that there is no moisture present in the environment where the device 10 is located for an extended period of time, the device 10 would still sweep the panel for dirt particles and debris when the arid climate setting is active, the dirt index is high and sufficient power is available. In such circumstances, the user may elect to install replaceable clear protective film on the panel cover.

Although the above description relates to a specific embodiment as presently contemplated by the inventor, it will be understood that the device in its broad aspect includes mechanical and functional equivalents of the elements described herein.

We claim:

1. An autonomous cleaning device for a solar panel, the device comprising:
   a first stop located at one end of the solar panel;
   a cleaning member mounted for unidirectional movement over the solar panel, the cleaning member having a first cleaning portion for cleaning the solar panel as the cleaning member moves unidirectionally, the cleaning member abuttingly engages the first stop so as to force the cleaning member to axially rotate about a restricted path of travel to bring the first cleaning portion into contact with the solar panel; and
   a moisture intensity sensor in communication with the cleaning member, the moisture intensity sensor being located adjacent the solar panel or integral therewith, so as to determine when the moisture intensity reaches a level sufficient to cause the cleaning member to autonomously begin movement over the panel.

2. The device, according to claim 1, in which the first cleaning portion includes an extension body having a slot to slidably engage one or more cleaning inserts.

3. The device, according to claim 2, in which the cleaning insert is a pad or a brush for sweeping the solar panel, or a wiper for scraping the solar panel.

4. The device, according to claim 2, in which the cleaning inserts are spaced apart and extend from the cleaning member towards the solar panel.

5. The device, according to claim 2, in which the cleaning inserts are interchangeable.

6. The device, according to claim 2, in which the cleaning member extension body and cleaning inserts include complimentary grooves, humps or indentations to provide a releasable lock to permit pad, brush and wiper installation and replacement.

7. The device, according to claim 2, in which the cleaning inserts are attached by screws to the extension bodies.

8. The device, according to claim 2, in which the cleaning inserts are clamped to the extension bodies.

9. The device, according to claim 1, further includes a third cleaning portion.

10. The device, according to claim 1, further includes a second stop spaced apart from the first stop.

11. The device, according to claim 10, in which the cleaning member includes two stopping portions for contacting one of the respective stops when the cleaning member moves unidirectionally, the stops forcing the cleaning member to axially rotate so that the first cleaning portion contacts the solar panel.

12. The device, according to claim 11, in which the unidirectional movement of the cleaning member is abbreviated to avoid contacting the stops.

13. The device, according to claim 1, in which the cleaning member tapers away from the first cleaning portion.

14. The device, according to claim 1, in which the cleaning member is movably mounted on the top, sides, or bottom of a frame.

15. The device, according to claim 14, in which the frame includes a drive assembly to drive the cleaning member across the solar panel.

16. The device, according to claim 15, in which the drive assembly includes:
   a) one drive shaft;
   b) a gear connected to the drive shaft; and
   c) a prime mover connected to the gear.

17. The device, according to claim 16, in which the drive assembly includes the one drive shaft in a shaft enclosure.

18. The device, according to claim 16, in which the drive assembly includes a guide having a guide slot therein, the guide being located substantially parallel to the drive shaft.

19. The device, according to claim 14, in which the cleaning member and the frame are slidably extendable, the frame having one or more mounting straps and a mounting buckle or a clamp for locating the device over the solar panel.

20. The device, according to claim 1, in which the moisture intensity sensor is a rain sensor, the rain sensor including a sensor circuit with a plurality of spaced apart strips connected in series, and a plurality of resistors connected to the strips, a reference voltage being in communication with the circuit for comparing with a signal voltage generated when a raindrop falls onto one or more of the spaced apart gaps; the circuit being configured such that heavier rain will cause the raindrops to bridge more gaps thereby permitting the sensor resistance to measure the rain intensity.

21. The device, according to claim 1, in which a temperature sensor is in communication with the cleaning member, the temperature sensor being located adjacent the solar panel or integrated into the panel production design.

22. The device, according to claim 21, in which a controller is connected to the moisture intensity sensor and the temperature sensor, and a drive assembly, the controller determining whether sufficient moisture intensity is available for unidirectional movement, the controller, the moisture intensity sensor, the temperature sensor and the drive assembly being powered by a power supply.

23. The device, according to claim 22, in which the power supply is an autonomous power supply.

24. The device, according to claim 23, in which the autonomous power supply is a photovoltaic cell array or a battery.

25. The device, according to claim 1, is located on a pedestal or frame.

26. The device, according to claim 1, is mounted on the roof, the side of a building or on the ground.

27. The device, according to claim 1, is mounted on a window or skylight, and for any transparent semi-transparent, or opaque materials, and connected to user supplied power.

28. The device, according to claim 1, is connected to a washing system for spraying a liquid on the solar panel or allowing collected rainwater from drainage channels along a panel frame to be implemented.

29. The device, according to claim 1, is incorporated into a production design.

30. The device, according to claim 1, which includes a replaceable clear protective film for use with the solar panel.

31. An autonomous cleaning device for a solar panel, the device comprising:
a first stop located at one end of the solar panel;
a cleaning member mounted for movement in one direction over the solar panel, the cleaning member having a first cleaning portion having one or more cleaning inserts for cleaning the solar panel as the cleaning member moves in the one direction along a restricted path of travel, the cleaning member abuttingly engages the first stop so as to force the cleaning member to axially rotate about a restricted path of travel to bring the first cleaning portion into contact with the solar panel; and
a moisture intensity sensor in communication with the cleaning member, the moisture intensity sensor being located adjacent the solar panel or integral therewith, so as to determine when the moisture intensity reaches a level sufficient to cause the cleaning member to autonomously begin movement over the solar panel.

32. The device, according to claim 31, in which the first cleaning portion includes an extension body having a slot to slidably engage one or more cleaning inserts.

33. The device, according to claim 32, in which the cleaning insert is selected from the group consisting of: a pad, a brush for sweeping the solar panel, and a wiper for scraping the solar panel.

34. The device, according to claim 32, in which the cleaning inserts are spaced apart and extend from the cleaning member towards the solar panel.

35. The device, according to claim 32, in which the cleaning inserts are interchangeable.

36. The device, according to claim 32, in which the cleaning inserts are attached by screws to the extension bodies.

37. The device, according to claim 32, in which the cleaning inserts are clamped to the extension bodies.

38. The device, according to claim 31, further includes a second stop spaced apart from the first stop.

39. The device, according to claim 38, in which the cleaning member includes two stopping portions for contacting the respective stops when the cleaning member moves in the one direction, the stops forcing the cleaning member so that the first cleaning portion contacts the solar panel.

40. The device, according to claim 38, in which in the one direction the movement of the cleaning member is abbreviated to avoid contacting the stops so that the first cleaning portion is always in contact with the solar panel.

41. The device, according to claim 31, in which the cleaning member tapers away from the first cleaning portion.

42. The device, according to claim 31, in which the cleaning member is movably mounted on the top, sides, or bottom of a frame.

43. The device, according to claim 42, in which the frame includes a drive assembly to drive the cleaning member across the solar panel.

44. The device, according to claim 43, in which the drive assembly includes:
a) one drive shaft;
b) a gear connected to the drive shaft; and
c) a prime mover connected to the gear.

45. The device, according to claim 44, in which the drive assembly includes the one drive shaft enclosed in a shaft enclosure.

46. The device, according to claim 44, in which the drive assembly includes a guide having a guide slot therein, the guide being located substantially parallel to the drive shaft.

47. The device, according to claim 42, in which the cleaning member and the frame are slidably extendable, the frame having one or more mounting straps and a mounting buckle for locating the device over the solar panel.

48. The device, according to claim 31, in which the moisture intensity sensor is a rain sensor, the rain sensor including a sensor circuit with a plurality of spaced apart strips connected in series, and a plurality of resistors connected to the strips, a reference voltage being in communication with the circuit for comparing with a signal voltage generated when a raindrop falls onto one or more of the spaced apart gaps; the circuit being configured such that heavier rain will cause the raindrops to bridge more gaps thereby permitting the sensor resistance to measure the rain intensity.

49. The device, according to claim 31, in which a temperature sensor is in communication with the cleaning member, the temperature sensor being located adjacent the solar panel or integral with the panel.

50. The device, according to claim 31, in which a controller is connected to the moisture intensity sensor, the temperature sensor, and a drive assembly, the controller determining whether sufficient moisture intensity is available for unidirectional movement, the controller, the moisture intensity sensor, the temperature sensor and the drive assembly being powered by a power supply.

51. The device, according to claim 50, in which the power supply is an autonomous power supply.

52. The device, according to claim 51, in which the autonomous power supply is a photovoltaic cell array or a battery.

53. The device, according to claim 31, is located on a pedestal or frame.

54. The device, according to claim 31, is mounted on the roof, the side of a building or on the ground.

55. The device, according to claim 31, is mounted on window or skylight, and for any transparent semi-transparent or opaque materials, and connected to user supplied power.

56. The device, according to claim 31, is connected to a washing system for spraying a liquid on the solar panel.

57. The device, according to claim 31, in which the cleaning member extension body and cleaning inserts include complimentary grooves, humps or indentations to provide a releasable lock to permit pad, brush and wiper installation and replacement.

58. The device, according to claim 31, is incorporated into a production design.

59. The device, according to claim 31, in which the solar panel includes a replaceable clear protective film.

60. An autonomous cleaning device for a solar panel, the device comprising:
a first stop located at one end of the solar panel;
a cleaning member mounted for bidirectional movement over the solar panel, the cleaning member having a first and second cleaning portions for cleaning the solar panel as the cleaning member move thereover, the first and second cleaning portions being respectively brought into contact with the solar panel when the cleaning member abuttingly engages the first stop so as to force the cleaning member to axially rotate about a restricted path of travel; and
a moisture intensity sensor in communication with the cleaning member, the moisture intensity sensor being located adjacent the solar panel or integral therewith, so as to determine when the moisture intensity reaches a level sufficient to cause the cleaning member to autonomously begin movement over the solar panel.

61. The device, according to claim 60, in which the first and second cleaning portions each includes an extension body having a slot to slidably engage one or more cleaning inserts.

62. The device, according to claim 61, in which the cleaning insert is a pad or a brush for sweeping the solar panel, or a wiper for scraping the solar panel.

63. The device, according to claim 61, in which the cleaning inserts are spaced apart and extend from the cleaning member towards the solar panel.

64. The device, according to claim 61, in which the cleaning inserts are interchangeable.

65. The device, according to claim 61, in which the cleaning inserts are attached by screws to the extension bodies.

66. The device, according to claim 61, in which the cleaning inserts are clamped to the extension bodies.

67. The device, according to claim 60, further includes a third cleaning portion.

68. The device, according to claim 60, further includes a second stop spaced apart from the first stop.

69. The device, according to claim 60, in which the cleaning member includes two stopping portions for contacting the respective stops when the cleaning member moves over the solar panel, the stops forcing the cleaning member to axially rotate so that either the first or the second cleaning portions contacts the solar panel.

70. The device, according to claim 60, in which the cleaning member tapers away from the first and second cleaning portions.

71. The device, according to claim 60, in which the cleaning member is movably mounted on the top, sides, or bottom of a frame.

72. The device, according to claim 71, in which the frame includes a drive assembly to drive the cleaning member across the solar panel.

73. The device, according to claim 72, in which the drive assembly includes:
a) one drive shaft;
b) a gear connected to the drive shaft; and
c) a prime mover connected to the gear.

74. The device, according to claim 73, in which the drive assembly includes the one drive shaft in a shaft enclosure.

75. The device, according to claim 73, in which the drive assembly includes a guide having a guide slot therein, the guide being located substantially parallel to the drive shaft.

76. The device, according to claim 71, in which the cleaning member and the frame are slidably extendable, the frame having one or more mounting straps and a mounting buckle or a clamp for locating the device over the solar panel.

77. The device, according to claim 60, in which the moisture intensity sensor is a rain sensor, the rain sensor including a sensor circuit with a plurality of spaced apart strips connected in series, and a plurality of resistors connected to the strips, a reference voltage being in communication with the circuit for comparing with a signal voltage generated when a raindrop falls onto one or more of the spaced apart gaps; the circuit being configured such that heavier rain will cause the raindrops to bridge more gaps thereby permitting the sensor resistance to measure the rain intensity.

78. The device, according to claim 60, in which a temperature sensor is in communication with the cleaning member, the temperature sensor being located adjacent the solar panel or panel production design.

79. The device, according to claim 60, in which a controller is connected to the moisture intensity sensor, the temperature sensor, and a drive assembly, the controller determining whether sufficient moisture intensity is available for unidirectional movement, the controller, the moisture intensity sensor, the temperature sensor and the drive assembly being powered by a power supply.

80. The device, according to claim 79, in which the power supply is an autonomous power supply.

81. The device, according to claim 80, in which the autonomous power supply is a photovoltaic cell array or a battery.

82. The device, according to claim 60, is located on a pedestal or frame.

83. The device, according to claim 60, is mounted on the roof, the side of a building or on the ground.

84. The device, according to claim 60, is mounted on a window or skylight, and for any transparent semi-transparent, or opaque materials, and connected to user supplied power.

85. The device, according to claim 60, is connected to a washing system for spraying a liquid on the solar panel or allowing collected rainwater from drainage channels along a panel frame to be implemented.

86. The device, according to claim 60, in which the cleaning member extension body and cleaning inserts include complimentary grooves, humps or indentations to provide a releasable lock to permit pad, brush and wiper installation and replacement.

87. The device, according to claim 60, in which the cleaning member is incorporated into a production design.

88. The device, according to claim 60, in which the solar panel includes a replaceable clear protective film.

89. A system for autonomously cleaning a solar panel, the system comprising:
a moisture intensity sensor to determine when moisture intensity reaches a level sufficient to begin cleaning;
a temperature sensor;
a controller in communication with the sensors; and
a cleaning member mounted for unidirectional movement over the solar panel, the cleaning member being in communication with the controller, the cleaning member having a first cleaning portion, the system being configured such that in response to the intensity of moisture being detected on the moisture intensity sensor the controller activates the cleaning member such that:
i) the cleaning member moves unidirectionally and the first cleaning portion cleans the solar panel; the cleaning member abuttingly engages a first stop and is axially rotatable about a restricted path of travel.

90. The system, according to claim 89, in which the first cleaning portion is a sweeper.

91. The system, according to claim 89, in which the first cleaning portion is selected from the group consisting of: a pad, a brush for sweeping the solar panel, and a wiper for scraping the solar panel for unidirectional cleaning.

92. The system, according to claim 89, further includes a dirt index dial and a climate index dial.

93. The system, according to claim 89, in which the first cleaning portion includes an extension body having a slot to slidably engage one or more cleaning inserts.

94. The system, according to claim 93, in which the cleaning insert is a pad or a brush for sweeping the solar panel, or a wiper for scraping the solar panel.

95. The system, according to claim 93, in which the cleaning inserts are spaced apart and extend from the cleaning member towards the solar panel.

96. The system, according to claim 93, in which the cleaning inserts are interchangeable.

97. The system, according to claim 89, in which the cleaning member moves unidirectionally over the solar panel.

98. A system for autonomously cleaning a solar panel, the system comprising:
a moisture intensity sensor to determine when moisture intensity reaches a level sufficient to begin cleaning, the intensity level being sufficient for moisture to substantially cover the panel;
a temperature sensor;
a controller in communication with the sensors; and
a cleaning member mounted for movement in one direction over the solar panel, the cleaning member being in communication with the controller, the cleaning member having a first cleaning portion, the system being configured such that in response to the intensity of moisture being detected on the moisture intensity sensor, the controller activates the cleaning member such that the cleaning member moves in the one direction along a restricted path of travel and the first cleaning portion cleans the solar panel, the cleaning member abuttingly engaging a stop so as to axially rotate.

99. The system, according to claim 98, further includes a dirt index dial and a climate index dial.

100. The system, according to claim 98, in which the first cleaning portion includes an extension body having a slot to slidably engage one or more cleaning inserts.

101. The system, according to claim 99, in which the cleaning insert is a pad or a brush for sweeping the solar panel, or a wiper for scraping the solar panel.

102. The system, according to claim 100, in which the cleaning inserts are spaced apart and extend from the cleaning member towards the solar panel.

103. The system, according to claim 100, in which the cleaning inserts are interchangeable.

104. A system for autonomously cleaning a solar panel, the system comprising:
a moisture intensity sensor to determine when moisture intensity reaches a level sufficient to begin cleaning, the intensity level being sufficient for moisture to substantially cover the panel;
a temperature sensor;
a controller in communication with the sensors; and
a cleaning member mounted for bidirectional movement over the solar panel, the cleaning member being in communication with the controller, the cleaning member having a first cleaning portion and a second cleaning portion, the system being configured such that in response to the intensity of moisture being detected on the moisture intensity sensor the controller activates the cleaning member such that the cleaning member moves bidirectionally and the first cleaning portion cleans the solar panel; and the cleaning member abuttingly engages a stop so as to axially rotate about a restricted path of travel so that the second cleaning portion is brought into contact with the solar panel and the second cleaning portion cleans the solar panel.

105. The system, according to claim 104, in which the first cleaning portion is a sweeper and the second cleaning portion is a scraper for bi-directional cleaning.

106. The system, according to claim 104, in which the first cleaning portion is selected from the group consisting of: a pad, a brush for sweeping the solar panel, and a wiper for scraping the solar panel for unidirectional cleaning.

107. The system, according to claim 104, further includes a dirt index dial and a climate index dial.

108. The system, according to claim 104, in which the first and second cleaning portions each includes an extension body having a slot to slidably engage one or more cleaning inserts.

109. The system, according to claim 108, in which the cleaning insert is a pad or a brush for sweeping the solar panel, or a wiper for scraping the solar panel.

110. The system, according to claim 108, in which the cleaning inserts are spaced apart and extend from the cleaning member towards the solar panel.

111. The system, according to claim 108, in which the cleaning inserts are interchangeable.

* * * * *